United States Patent
Saito et al.

(10) Patent No.: US 9,818,855 B2
(45) Date of Patent: Nov. 14, 2017

(54) SEMICONDUCTOR DEVICE

(71) Applicant: Kabushiki Kaisha Toshiba, Minato-ku (JP)

(72) Inventors: Hisashi Saito, Yokohama (JP);
Masahiko Kuraguchi, Yokohama (JP);
Tatsuo Shimizu, Shinagawa (JP);
Shintaro Nakano, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/235,391

(22) Filed: Aug. 12, 2016

(65) Prior Publication Data

US 2017/0077277 A1 Mar. 16, 2017

(30) Foreign Application Priority Data

Sep. 14, 2015 (JP) ................. 2015-181270

(51) Int. Cl.
*H01L 29/778* (2006.01)
*H01L 29/51* (2006.01)
(Continued)

(52) U.S. Cl.
CPC .... *H01L 29/7786* (2013.01); *H01L 21/02145* (2013.01); *H01L 21/02266* (2013.01); *H01L 21/28264* (2013.01); *H01L 23/291* (2013.01); *H01L 29/513* (2013.01); *H01L 29/518* (2013.01); *H01L 29/66462* (2013.01); *H01L 29/1066* (2013.01); *H01L 29/2003* (2013.01);
(Continued)

(58) Field of Classification Search
CPC . H01L 29/2003; H01L 33/32; H01L 21/0254; H01L 21/02458
See application file for complete search history.

(56) References Cited

U.S. PATENT DOCUMENTS 8,866,157 B2 10/2014 Nakamura et al.
2006/0264066 A1 11/2006 Bartholomew et al.
(Continued)

FOREIGN PATENT DOCUMENTS

JP 2008-536318 9/2008
JP 2010-272728 12/2010
(Continued)

OTHER PUBLICATIONS

Axel Palmstrom "Characterization of SiAlON for Hydrogen Diffusion Barrier Application in Nonvolatile Memory Devices", 2010 NNIN REU Research Accomplishments, 2010, 2 pages.

*Primary Examiner* — Quoc Hoang
(74) *Attorney, Agent, or Firm* — Oblon, McClelland, Maier & Neustadt, L.L.P.

(57) ABSTRACT

A semiconductor device according to an embodiment includes a first nitride semiconductor layer; a source electrode provided on the first nitride semiconductor layer; a drain electrode provided on the first nitride semiconductor layer; a gate electrode provided between the source electrode and the drain electrode; a first film provided between the source electrode and the gate electrode and between the gate electrode and the drain electrode; and a second film provided on the first film. The first film is provided on the first nitride semiconductor layer. The first film has a lower hydrogen diffusion coefficient than a hydrogen diffusion coefficient of a silicon oxide film.

21 Claims, 24 Drawing Sheets

(51) Int. Cl.
*H01L 29/66* (2006.01)
*H01L 21/28* (2006.01)
*H01L 21/02* (2006.01)
*H01L 23/29* (2006.01)
*H01L 29/20* (2006.01)
*H01L 29/423* (2006.01)
*H01L 29/40* (2006.01)
*H01L 29/10* (2006.01)

(52) U.S. Cl.
CPC ........ *H01L 29/404* (2013.01); *H01L 29/4236* (2013.01)

(56) References Cited

U.S. PATENT DOCUMENTS

| | | | |
|---|---|---|---|
| 2010/0096621 A1* | 4/2010 | Chuman | H01L 51/001 257/40 |
| 2011/0049529 A1* | 3/2011 | Sato | H01L 21/02164 257/76 |
| 2012/0146728 A1 | 6/2012 | Makiyama et al. | |
| 2012/0217544 A1 | 8/2012 | Ohki | |
| 2014/0084345 A1 | 3/2014 | Ohki et al. | |
| 2014/0353720 A1 | 12/2014 | Inoue et al. | |
| 2016/0225857 A1 | 8/2016 | Saito et al. | |

FOREIGN PATENT DOCUMENTS

| | | |
|---|---|---|
| JP | 2012-18166 | 1/2012 |
| JP | 2012-124436 | 6/2012 |
| JP | 2012-175018 | 9/2012 |
| JP | 2014-72225 | 4/2014 |
| JP | 2014-236105 | 12/2014 |
| JP | 5664661 | 2/2015 |
| JP | 2016-143842 | 8/2016 |

* cited by examiner

US 9,818,855 B2

SEMICONDUCTOR DEVICE

CROSS-REFERENCE TO RELATED APPLICATION

This application is based upon and claims the benefit of priority from Japanese Patent Application No. 2015-181270, filed on Sep. 14, 2015, the entire contents of which are incorporated herein by reference.

FIELD

Embodiments described herein relate generally to a semiconductor device.

BACKGROUND

For example, a semiconductor element such as a switching element or a diode is used in a circuit such as a switching power supply or an inverter. These semiconductor elements require a high breakdown voltage and a low on-resistance. A relation between the breakdown voltage and the on-resistance is a trade-off relation depending on a semiconductor material.

Due to the progress of the technological development, a semiconductor element which has a low on-resistance in the vicinity of a limit of a main semiconductor material silicon has been realized. In order to improve the breakdown voltage further or reduce the on-resistance further, it is necessary to change the semiconductor material. It is possible to improve the trade-off relation depending on a semiconductor material and to realize high breakdown voltage and low on-resistance by using a GaN-based semiconductor such as GaN or AlGaN, or a wide bandgap semiconductor such as silicon carbide (SiC) as a semiconductor material of a switching element.

DETAILED DESCRIPTION (First Embodiment)

Figure 1:
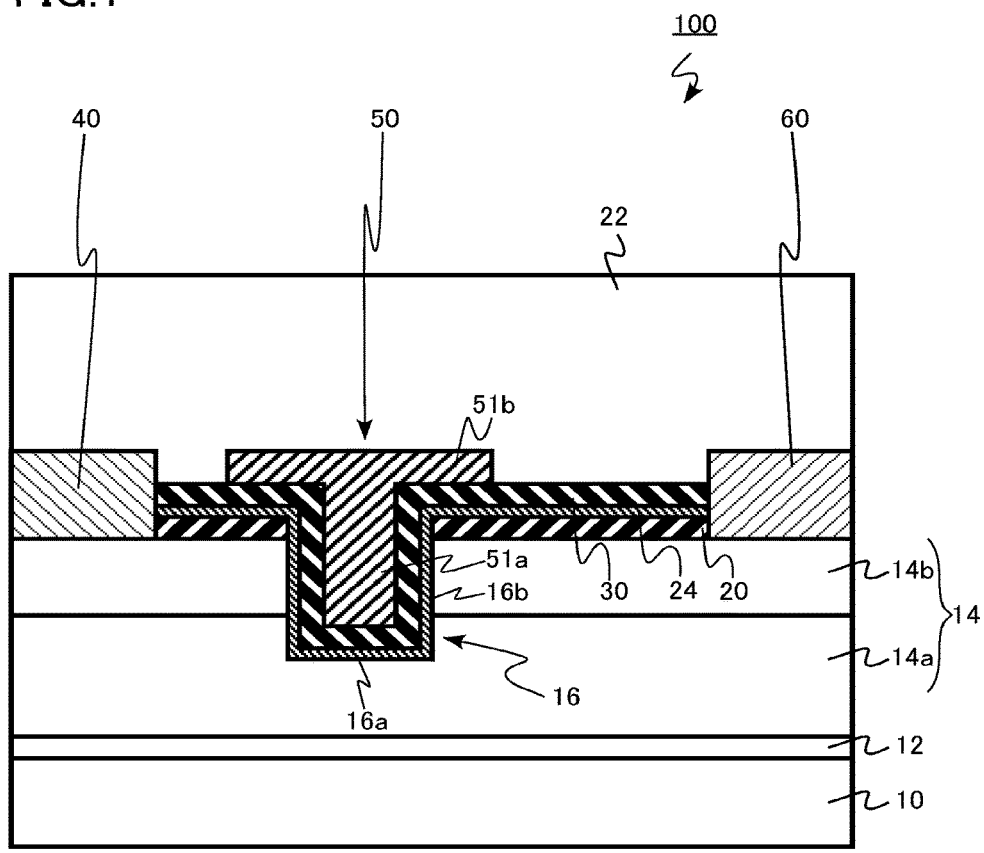
FIG. 1 is a schematic cross sectional view of a semiconductor device of a first embodiment.

A semiconductor device of the present embodiment includes a first nitride semiconductor layer; a source electrode provided on the first nitride semiconductor layer; a drain electrode provided on the first nitride semiconductor layer; a gate electrode provided between the source electrode and the drain electrode; a first film provided between the source electrode and the gate electrode and between the gate electrode and the drain electrode, the first film being provided on the first nitride semiconductor layer, the first film having a lower hydrogen diffusion coefficient than a hydrogen diffusion coefficient of a silicon oxide film; and a second film provided on the first film.

Hereinafter, embodiments of the present disclosure will be described with reference to the drawings.

Here, the same reference sign is given to the same or similar components, and repeated description thereof may be omitted.

Here, the "GaN-based semiconductor" is a general term for a semiconductor including GaN (gallium nitride), AlN (aluminum nitride), InN (indium nitride), and an intermediate composition thereof.

Here, "undoped" means that an impurity concentration is $1 \times 10^{16}$ cm$^{-3}$ or less.

Here, an upper direction in the drawings is described by "upper", and a lower direction in the drawings is described by "lower", in order to indicate positional relations between components or the like. Here, concepts of "upper" and "lower" do not necessarily indicate a relation to the gravity direction. In addition, the word "on" means not only that one is "directly on" the other but also that one is "indirectly on" the other. For example, "the A layer is provided on the B layer" means not only that the A layer may be in direct contact with B layer but also that the other layer such as C layer may be provided between the A layer and the B layer, i.e. the A layer is not directly contact with the B layer.

FIG. 1 is a schematic cross sectional view of the semiconductor device of the present embodiment. The semiconductor device of the present embodiment is a high electron mobility transistor (HEMT) using a GaN-based semiconductor.

A semiconductor device 100 includes a substrate 10, a third semiconductor layer 12, a first nitride semiconductor layer 14, a first film 20, a second film 22, a first nitride film 24, a first oxide film 30, a source electrode 40, a gate electrode 50, and a drain electrode 60.

Preferable examples of the substrate 10 include a silicon (Si) substrate, a silicon carbide (SiC) substrate, or a sapphire ($Al_2O_3$) substrate.

The first nitride semiconductor layer 14 is provided on the substrate 10. The first nitride semiconductor layer 14 preferably includes a first semiconductor layer 14a and a second semiconductor layer 14b provided on the first semiconductor layer 14a. The second semiconductor layer 14b has a larger bandgap than a band gap of the first semiconductor layer 14a in order to manufacture a transistor of a HEMT structure with a high mobility. The first semiconductor layer 14a is, for example, an undoped $Al_XGa_{1-X}N$ ($0 \leq X < 1$). More specifically, the first semiconductor layer 14a is, for example, an undoped GaN. The first semiconductor layer 14a has a thickness, for example, of 0.5 μm or more and 3 μm or less. The second semiconductor layer 14b is, for example, an undoped $Al_YGa_{1-Y}N$ ($0 \leq Y < 1$, $X < Y$). More specifically, the second semiconductor layer 14b is, for example, an undoped $Al_{0.2}Ga_{0.8}N$. The second semiconductor layer 14b has a thickness, for example, of 15 nm or more and 50 nm or less.

A heterojunction interface is formed between the first semiconductor layer 14a and the second semiconductor layer 14b. If the semiconductor device 100 is turned on, two dimensional electron gas (2DEG) is formed at the heterojunction interface to be a carrier.

The third semiconductor layer 12 is preferably provided between the substrate 10 and the first nitride semiconductor layer 14. The third semiconductor layer 12 is a buffer layer, and reduces lattice mismatch between the substrate 10 and the first nitride semiconductor layer 14. For example, the third semiconductor layer 12 has a multilayer structure of aluminum gallium nitride ($Al_WGa_{1-W}N$ ($0 < W < 1$)).

The source electrode 40 and the drain electrode 60 are provided on the first nitride semiconductor layer 14. The gate electrode 50 is provided between the source electrode 40 and the drain electrode 60, and the gate electrode 50 is provided on the first nitride semiconductor layer 14. For example, each of the source electrode 40, the gate electrode 50, and the drain electrode 60 is a metal electrode having a multilayer structure of titanium (Ti) and aluminum (Al) or nickel (Ni) and gold (Au). Each of the source electrode 40 and the drain electrode 60 is preferably in ohmic-contact with the first nitride semiconductor layer 14 or the second semiconductor layer 14b. A distance between the source electrode 40 and the drain electrode 60 is, for example, 5 μm or more and 30 μm or less.

For example, the first nitride semiconductor layer 14 includes a trench 16 provided on the first semiconductor layer 14a and the second semiconductor layer 14b. The trench 16 has a side surface 16b and a bottom 16a. The bottom 16a is provided in the first semiconductor layer 14a. For example, the gate electrode 50 includes a first electrode 51a provided in the trench 16 and a second electrode 51b provided above the second semiconductor layer 14b and electrically connected to the first electrode 51a. Thus, the semiconductor device 100 becomes a normally-off HEMT.

The first film 20 is provided between the source electrode 40 and the gate electrode 50 and between the gate electrode 50 and the drain electrode 60. The first film is provided on the first nitride semiconductor layer 14. A hydrogen diffusion coefficient of the first film 20 is lower than a hydrogen diffusion coefficient a silicon oxide film. For example, the silicon oxide film includes $SiO_2$.

For example, the first film 20 includes SiAlON. SiAlON includes silicon (Si), aluminum (Al), oxygen (O), and nitrogen (N). A film having a lower hydrogen diffusion coefficient than a hydrogen diffusion coefficient of the silicon oxide film can be thereby realized.

Otherwise, the first film 20 includes a hydrogen occlusion alloy, such as rare earth hydride. A film having a lower hydrogen diffusion coefficient than a hydrogen diffusion coefficient of the silicon oxide film can be thereby realized. It is preferable that the electrical resistivity of the first film 20 including the hydrogen occlusion alloy is $10^6$ ohm or more for the semiconductor device 100 to exhibit its function.

The hydrogen diffusion coefficients of the first film 20 and the silicon oxide film can be measured by a known method, for example, by releasing hydrogen electrochemically and integrating a current corresponding to a release rate of hydrogen with respect to time.

The second film 22 is provided on the first film 20. The second film 22 is an interlayer insulating film, and includes a silicon oxide such as $SiO_2$ or a silicon nitride such as SiN, for example.

The first oxide film 30 is provided between the first film 20 and the second film 22, between the second semiconductor layer 14b and the first electrode 51a in the trench 16, and between the first semiconductor layer 14a and the first electrode 51a in the trench 16. The first oxide film 30 is a gate insulating film. The first oxide film 30 has a thickness, for example, of 10 nm or more and 100 nm or less. The first oxide film 30 includes a silicon oxide such as $SiO_2$ or an aluminum oxide such as $Al_2O_3$, for example.

The first nitride film 24 is preferably provided between the first film 20 and the first oxide film 30, between the second semiconductor layer 14b and the first oxide film 30 in the trench 16, and between the first semiconductor layer 14a and the first oxide film 30 in the trench 16. The first nitride film 24 suppresses reduction in reliability of the semiconductor device 100 due to current collapse or the like caused by increase in an interface state density by formation of a gallium oxide (GaOx) on a surface of the first nitride semiconductor layer 14. The first nitride film 24 includes a silicon nitride such as SiN or an aluminum nitride such as AlN, for example.

The thickness of the first nitride film 24 is preferably smaller than the thickness of the first oxide film 30, 0.2 nm or more and less than 2 nm, in order not to exhibit a property as a bulk.

The sum of equivalent oxide thicknesses (EOT) of the first nitride film 24 and the first oxide film 30 is preferably 20 nm or more, which is preferable if the semiconductor device 100 is driven at a voltage of 10 V, and is preferably 100 nm or less, which is preferable if the semiconductor device 100 is driven at a voltage of 20 V.

The first nitride film 24 preferably includes single crystal aluminum nitride AlN because an electron trap is not easily formed at an interface between the first nitride semiconductor layer 14 and the first nitride film 24 and the semiconductor device 100 having excellent characteristics can be thereby obtained. Single crystal AlN can be preferably formed by a metal organic vapor phase epitaxy (MOCVD) method. Whether formed AlN is a single crystal can be evaluated, for example, by spectral ellipsometry, X-Ray diffraction (XRD), or observing a lattice image of AlN using a photograph of a cross section of the semiconductor device 100 with a transmission electron microscope (TEM).

Next, functions and effects of the semiconductor device 100 of the present embodiment will be described. FIGS. 2A-2D are diagrams illustrating functions and effects of the semiconductor device 100 of the present embodiment.

Figure 2A:
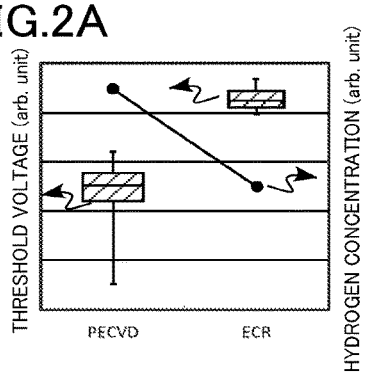
FIGS. 2A-2D are diagrams illustrating functions and effects of the semiconductor device of the first embodiment.

FIG. 2A is a diagram illustrating a relation between a hydrogen concentration in the second film 22 and a threshold voltage in each of a semiconductor device in which SiN as the second film 22 is formed by a plasma enhanced chemical vapor deposition (PECVD) method and a semiconductor device in which SiN as the second film 22 is formed by a sputtering method using electron cyclotron resonance (ECR) plasma. The first film 20 is not provided in either semiconductor device.

The hydrogen concentration in SiN formed by the PECVD method is more than $1 \times 10^{22}$ cm$^{-3}$. The hydrogen concentration in SiN formed by the sputtering method using ECR plasma is less than $1 \times 10^{21}$ cm$^{-3}$. An average threshold voltage in the semiconductor device 100 using SiN formed by the sputtering method using ECR plasma is larger than the threshold voltage in the semiconductor device 100 using SiN formed by the PECVD method.

Figure 2B:
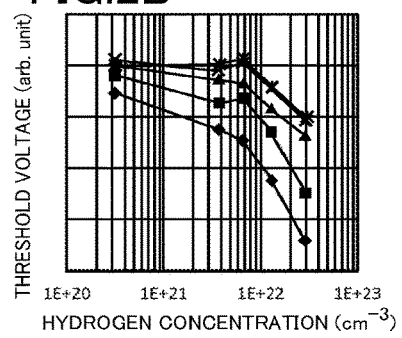

FIG. 2B is a graph illustrating a relation between a hydrogen concentration in the second film 22 and a threshold voltage. The different symbols on FIG. 2B indicate the data for the semiconductor device 100 having different gate length. Here, the second film 22 is a silicon oxide film or a silicon nitride film. The threshold voltage is reduced with increase in the hydrogen concentration in the semiconductor device having any gate length. Particularly, reduction in the threshold voltage is large in a semiconductor device using the second film 22 having a hydrogen concentration of $10^{22}$ cm$^{-3}$ or more.

Figure 2C:
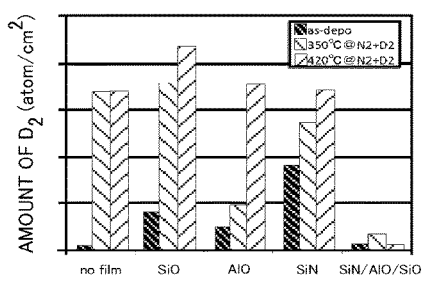

FIG. 2C illustrates an amount of deuterium per unit area included in a nitride semiconductor layer in each of a film obtained by forming no film on a surface of a model film (no film), a film obtained by forming a film of SiO (SiO), a film obtained by forming a film of AlO (AlO), a film obtained by forming a film of SiN (SiN), and a film obtained by forming films of SiN, AlO, and SiO (SiN/AlO/SiO). The amount of deuterium in the film obtained by forming films of SiN, AlO, and SiO is much smaller than the amounts of deuterium in the other films, which indicates that by forming films of SiN, AlO, and SiO, SiAlON having a small hydrogen diffusion coefficient is formed. Although FIG. 2C illustrates a result obtained by using deuterium, a similar result may be obtained by using hydrogen.

Figure 2D:
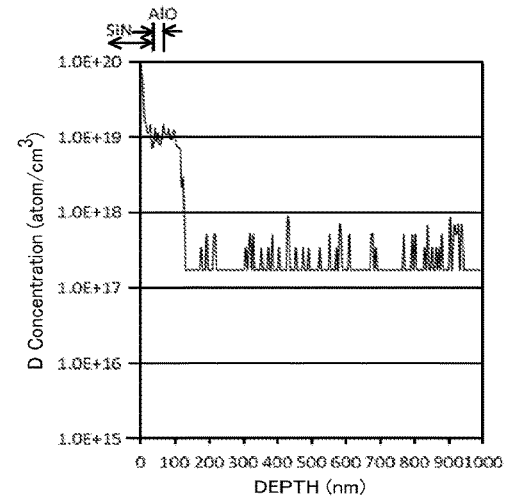

FIG. 2D illustrates a result obtained by measuring a deuterium concentration in a depth direction by secondary ion mass spectrometry (SIMS). A part in which films of SiN and AlO are formed has a high deuterium concentration. However, a part deeper than the films of SiN and AlO, i.e. a part whose depth is larger than about 130 nm or more has a low deuterium concentration. This result indicates that formation of SiAlON in the part in which the films of SiN and AlO are formed suppresses diffusion of deuterium. Although FIG. 2D illustrates a result obtained by using deuterium, a similar result may be obtained by using hydrogen.

As described above, threshold variation can be suppressed by using a film having a small hydrogen diffusion coefficient such as a film containing Si, Al, O, and N as the first film 20 in a semiconductor device using the second film 22 having a hydrogen concentration of $10^{22}$ cm$^{-3}$ or more. A film having a smaller hydrogen diffusion coefficient than a hydrogen diffusion coefficient of a silicon oxide film used generally as an interlayer insulating film can be preferably used as the first film 20.

A hydrogen occlusion alloy can occlude hydrogen in the alloy, and therefore has a small hydrogen diffusion coefficient. Thus, the hydrogen occlusion alloy can be preferably used as the first film 20.

Next, a method for manufacturing the semiconductor device 100 of the present embodiment will be described. FIGS. 3 to 7 are schematic cross sectional views of the semiconductor device 100 of the present embodiment during a manufacturing process in the method for manufacturing the semiconductor device 100.

The method for manufacturing the semiconductor device 100 of the present embodiment includes forming the third semiconductor layer 12 on the substrate 10 by an epitaxial growth method, forming the first semiconductor layer 14a on the third semiconductor layer 12 by an epitaxial growth method, forming the second semiconductor layer 14b on the first semiconductor layer 14a by an epitaxial growth method, forming the first film 20 having a lower hydrogen diffusion coefficient than a silicon oxide film on the second semiconductor layer 14b, forming the trench 16 having a bottom in the first semiconductor layer 14a on the first film 20 (on the first semiconductor layer 14a and the second semiconductor layer 14b), forming the first nitride film 24 on the first film 20, the bottom 16a of the trench 16, and the side surface 16b of the trench 16, forming the first oxide film 30 on the first nitride film 24, forming the source electrode 40 on the second semiconductor layer 14b, forming the drain electrode 60 on the second semiconductor layer 14b, forming the gate electrode 50 on the trench 16 provided on the first semiconductor layer 14a and the second semiconductor layer 14b and on the second semiconductor layer 14b, and forming the second film 22 having a hydrogen concentration of $10^{22}$ cm$^{-3}$ or more on the source electrode 40, the first oxide film 30, the gate electrode 50, and the drain electrode 60.

Figure 3:
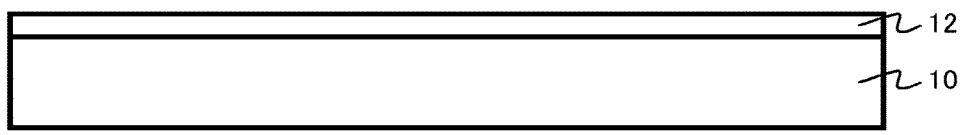
FIG. 3 is a schematic cross sectional view of a semiconductor device during a manufacturing process in a method for manufacturing the semiconductor device of the first embodiment.

First, as illustrated in FIG. 3, the third semiconductor layer 12 is formed on the substrate 10 by an epitaxial growth method.

Figure 4:
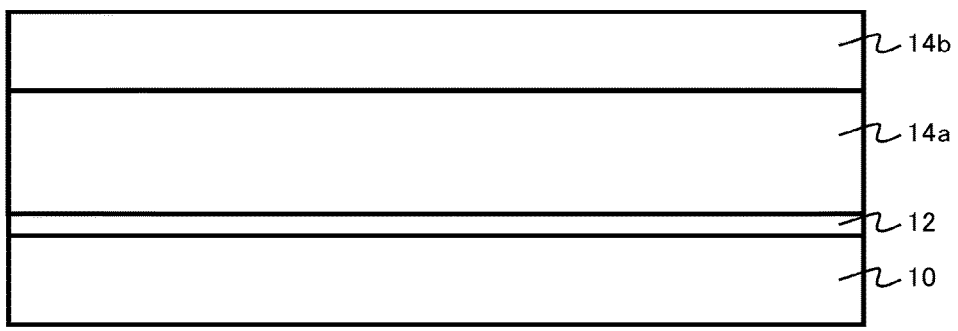
FIG. 4 is a schematic cross sectional view of the semiconductor device during the manufacturing process in the method for manufacturing the semiconductor device of the first embodiment.

Subsequently, as illustrated in FIG. 4, the first semiconductor layer 14a is formed on the third semiconductor layer 12 by an epitaxial growth method, and the second semiconductor layer 14b is formed on the first semiconductor layer 14a by an epitaxial growth method.

Figure 5:
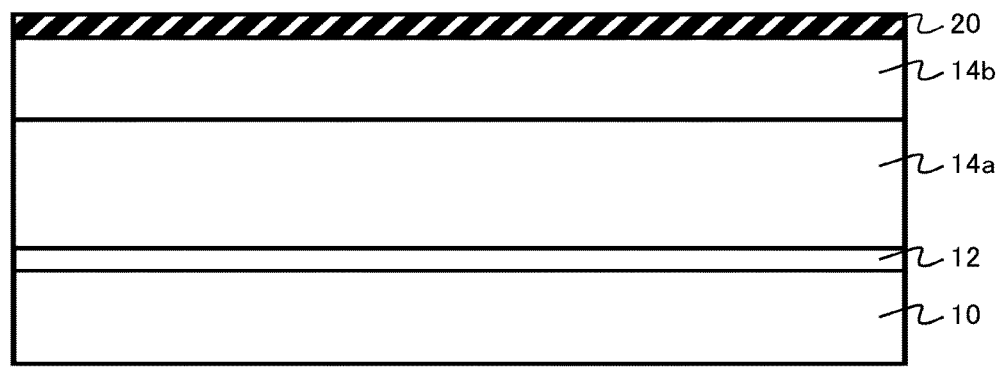
FIG. 5 is a schematic cross sectional view of the semiconductor device during the manufacturing process in the method for manufacturing the semiconductor device of the first embodiment.

Subsequently, as illustrated in FIG. 5, the first film 20 is formed on the second semiconductor layer 14b. Here, if the first film 20 includes Si, Al, O, and N, the first film 20 can be formed on the second semiconductor layer 14b, for example, by sputtering Si and Al in atmospheres of $O_2$ gas and $N_2$ gas. If the first film 20 is made of a hydrogen occlusion alloy, for example, the first film 20 can be formed by a sputtering method using an alloy target having an element ratio of a hydrogen occlusion alloy to be formed.

Figure 6:
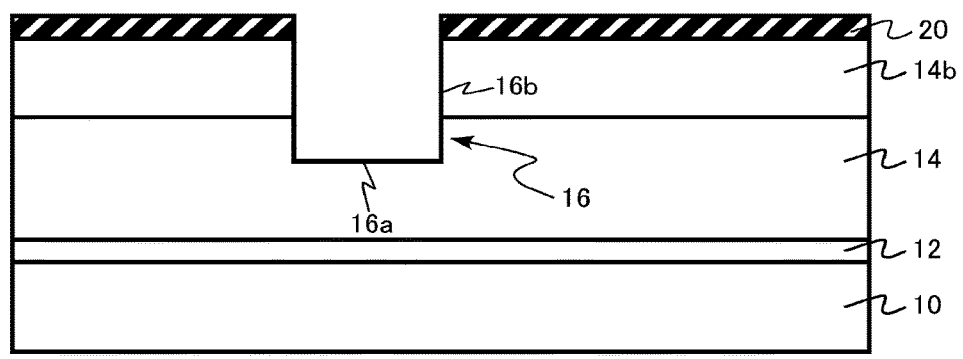
FIG. 6 is a schematic cross sectional view of the semiconductor device during the manufacturing process in the method for manufacturing the semiconductor device of the first embodiment.

Subsequently, as illustrated in FIG. 6, the trench 16 having a bottom in the first semiconductor layer 14a is formed on the first film 20 (on the first semiconductor layer 14a and the second semiconductor layer 14b).

Figure 7:
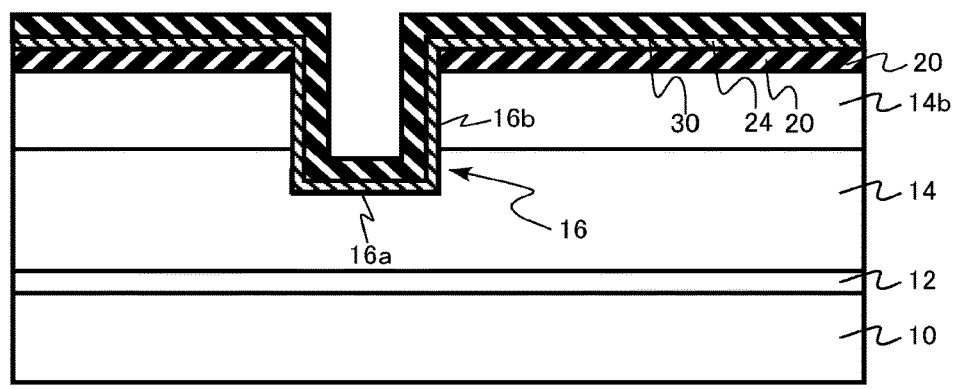
FIG. 7 is a schematic cross sectional view of the semiconductor device during the manufacturing process in the method for manufacturing the semiconductor device of the first embodiment.

Subsequently, as illustrated in FIG. 7, the first nitride film 24 is formed on the first film 20, the bottom 16a of the trench 16, and the side surface 16b of the trench 16. Subsequently, the first oxide film 30 is formed on the first nitride film 24.

Subsequently, the source electrode 40 is formed on the second semiconductor layer 14b, the drain electrode 60 is formed on the second semiconductor layer 14b, the gate electrode 50 is formed on the trench 16 provided on the first semiconductor layer 14a and the second semiconductor layer 14b, and is formed on the second semiconductor layer 14b. Subsequently, the second film 22 having a hydrogen concentration of $10^{22}$ cm$^{-3}$ or more is formed on the source electrode 40, the first oxide film 30, the gate electrode 50, and the drain electrode 60, for example, by a sputtering method to obtain the semiconductor device 100.

As described above, according to the semiconductor device 100 of the present embodiment, a semiconductor device in which threshold variation is suppressed can be provided.

(Second Embodiment)

A semiconductor device 200 of the present embodiment is different from the semiconductor device 100 of the first embodiment in that a second nitride film 26 is provided between a second semiconductor layer 14b and a first film 20 and that a second oxide film 32 is provided between a first film 20 and a first nitride film 24. Here, description of contents overlapping with the first embodiment will be omitted.

Figure 8:
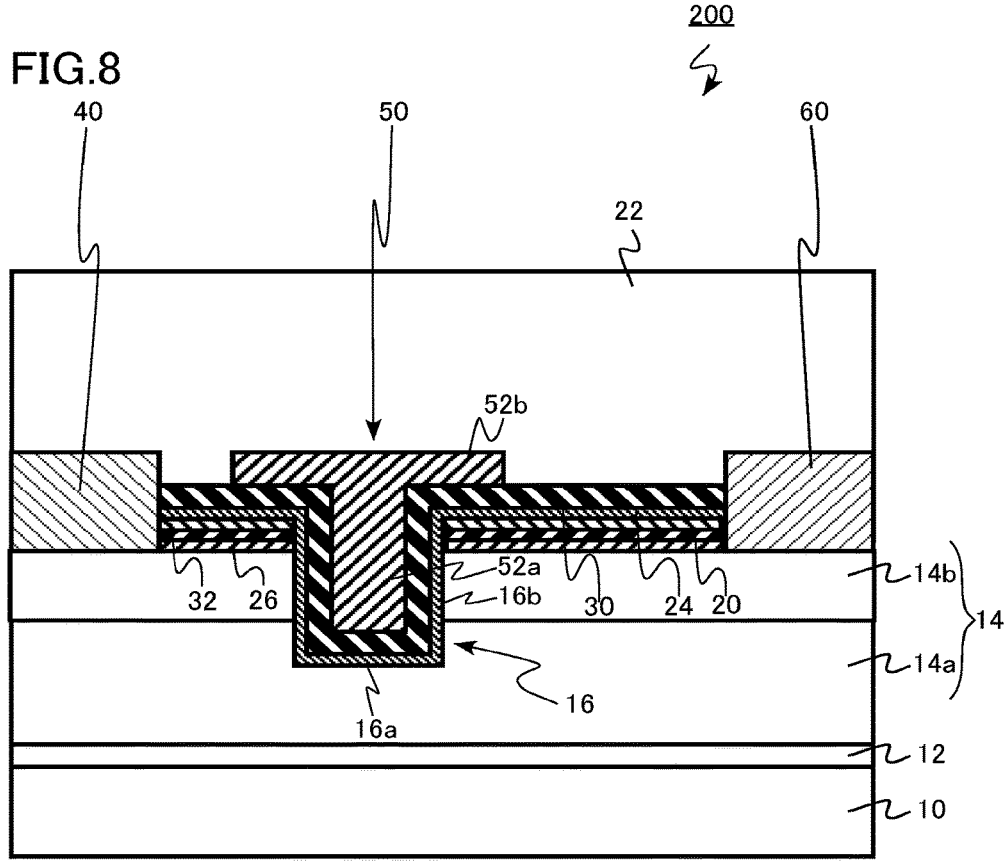
FIG. 8 is a schematic cross sectional view of a semiconductor device of a second embodiment.

FIG. 8 is a schematic cross sectional view of the semiconductor device 200 of the present embodiment.

In the semiconductor device 200 illustrated in FIG. 8, the second nitride film 26 is formed on the second semiconductor layer 14b, the second oxide film 32 is formed on the second nitride film 26, and the first film 20 containing silicon, aluminum, oxygen, and nitrogen, such as SiAlON, is formed between the second nitride film 26 and the second oxide film 32 by a reaction between the second nitride film 26 and the second oxide film 32 by a heat treatment. If the second nitride film 26 is a silicon nitride film containing SiN or the like, the second oxide film 32 is preferably an aluminum oxide film containing Al$_2$O$_3$ or the like. If the second nitride film 26 is an aluminum nitride film containing AlN or the like, the second oxide film 32 is preferably a silicon oxide film containing SiO$_2$ or the like. The second nitride film 26 and/or the second oxide film 32 may disappear due to some kind of reactions in the heat treatment.

According to the semiconductor device 200 of the present embodiment, a semiconductor device in which threshold variation is suppressed can be also provided.

(Third Embodiment)

A semiconductor device 300 of the present embodiment is different from the semiconductor device of the first or second embodiment in that a first film 20 is formed on a first oxide film 30. Here, description of contents overlapping with the first embodiment or the second embodiment will be omitted.

Figure 9:
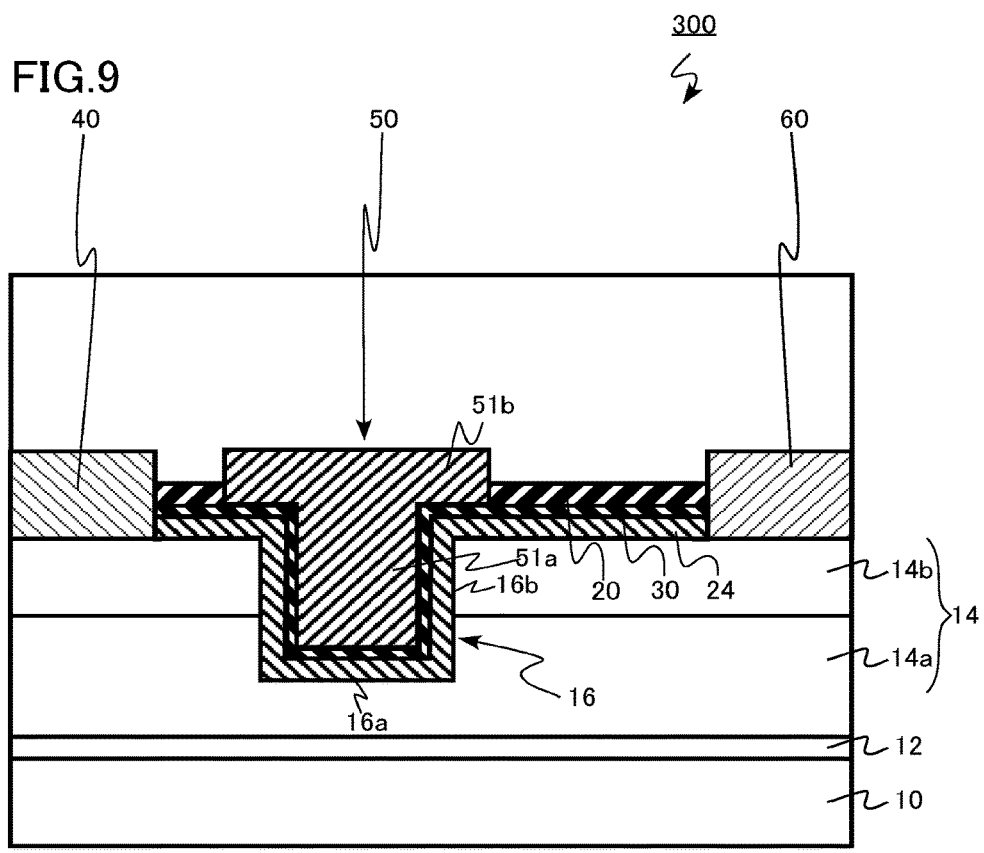
FIG. 9 is a schematic cross sectional view of a semiconductor device of a third embodiment.

FIG. 9 is a schematic cross sectional view of the semiconductor device 300 of the present embodiment. According to the semiconductor device 300 of the present embodiment, a semiconductor device in which threshold variation is suppressed can be also provided.

(Fourth Embodiment)

A semiconductor device 400 of the present embodiment is different from the semiconductor device 300 of the third embodiment in that a second nitride film 26 is formed on a first film 20. Here, description of contents overlapping with the semiconductor device of any one of the first to third embodiments will be omitted.

Figure 10:
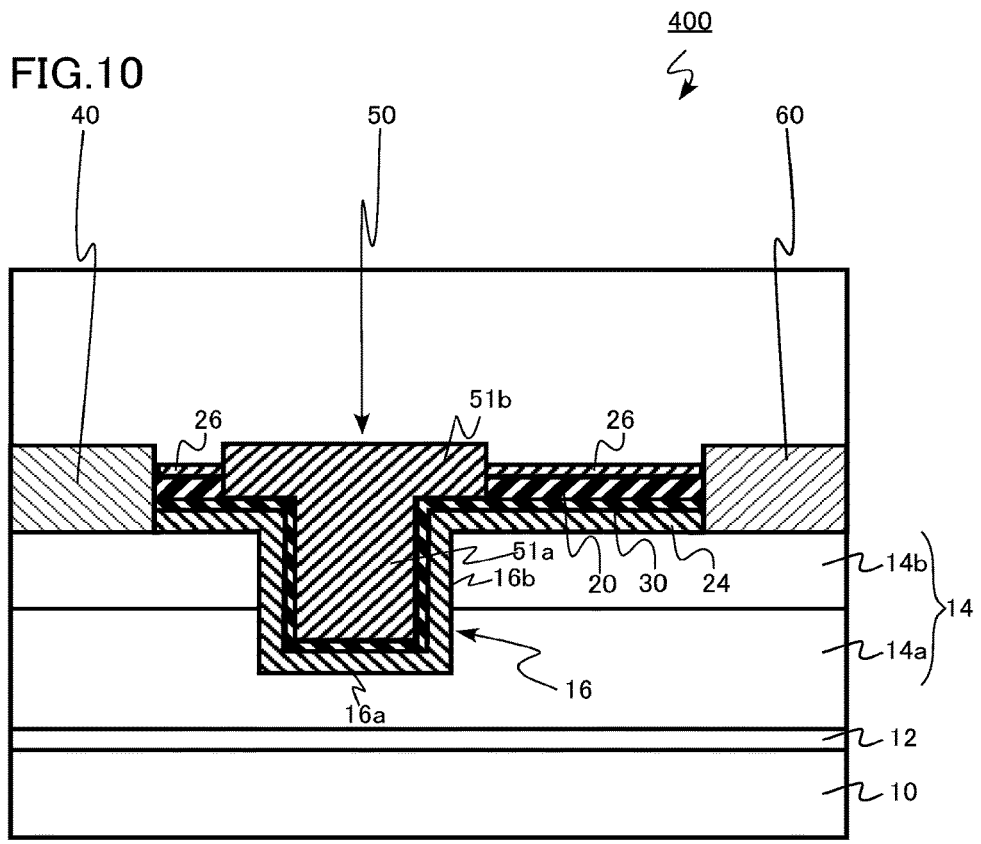
FIG. 10 is a schematic cross sectional view of a semiconductor device of a fourth embodiment.

FIG. 10 is a schematic cross sectional view of a semiconductor device 400 of the present embodiment.

In the semiconductor device 400 illustrated in FIG. 10, the first film 20 containing silicon, aluminum, oxygen, and nitrogen, such as SiAlON, is formed between a first oxide film 30 and the second nitride film 26 by a reaction between the first oxide film 30 and the second nitride film 26 by a heat treatment. If the second nitride film 26 is a silicon nitride film containing SiN or the like, the first oxide film 30 is preferably an aluminum oxide film containing Al$_2$O$_3$ or the like. If the second nitride film 26 is an aluminum nitride film containing AlN or the like, the first oxide film 30 is preferably a silicon oxide film containing SiO$_2$ or the like. The second nitride film 26 may disappear due to some kind of reactions in the heat treatment.

According to the semiconductor device 400 of the present embodiment, a semiconductor device in which threshold variation is suppressed can be also provided.

(Fifth Embodiment)

A semiconductor device 500 of the present embodiment is different from the semiconductor device of any one of the first to fourth embodiments in that a first film 20 is provided on a second semiconductor layer 14b, between the second semiconductor layer 14b and a first electrode 51a in a trench 16, and between a first semiconductor layer 14a and the first electrode 51a in the trench 16 and that a first nitride film 24 is provided between the second semiconductor layer 14b and the first film 20, between the second semiconductor layer 14b and the first film 20 in the trench 16, and between the first semiconductor layer 14a and the first film 20 in the trench 16. Here, description of contents overlapping with the first to fourth embodiments will be omitted.

Figure 11:
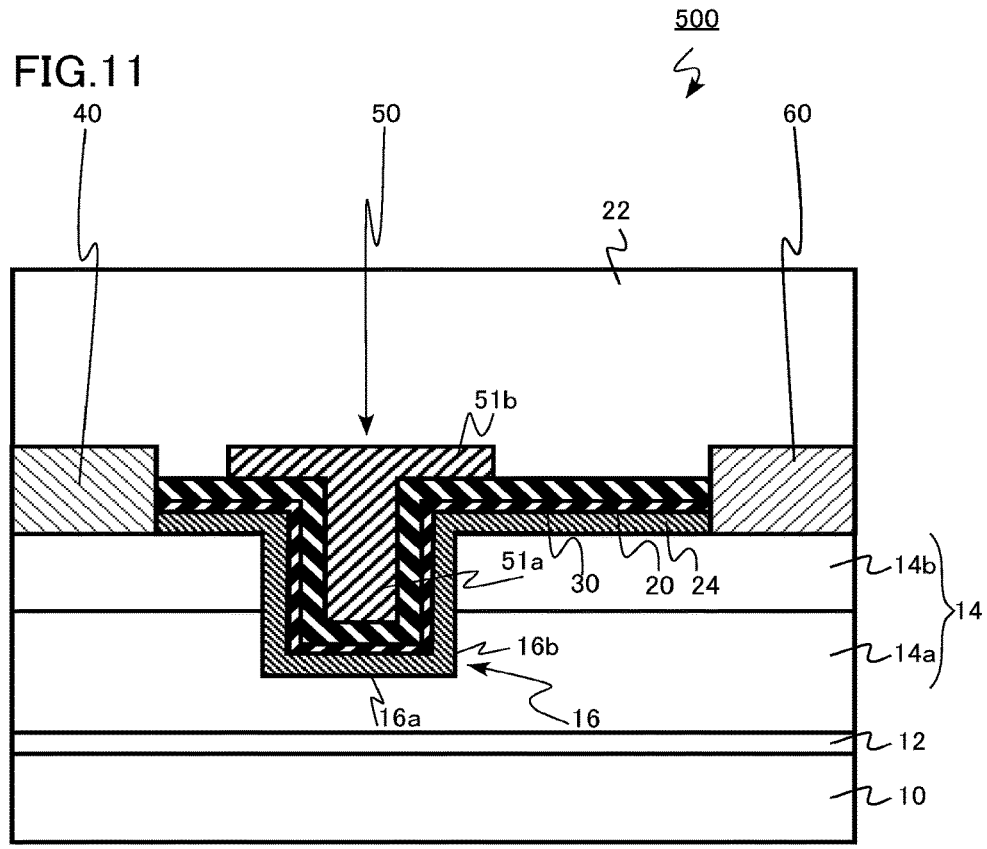
FIG. 11 is a schematic cross sectional view of a semiconductor device of a fifth embodiment.

FIG. 11 is a schematic cross sectional view of the semiconductor device 500 of the present embodiment. According to the semiconductor device 500 of the present embodiment, a semiconductor device in which threshold variation is suppressed can be also provided.

(Sixth Embodiment)

A semiconductor device 600 of the present embodiment is different from the semiconductor device 500 of the fifth embodiment in that a second nitride film 26 is provided between a first nitride film 24 and a first film 20. Here, description of contents overlapping with the semiconductor device of any one of the first to fifth embodiments will be omitted.

Figure 12:
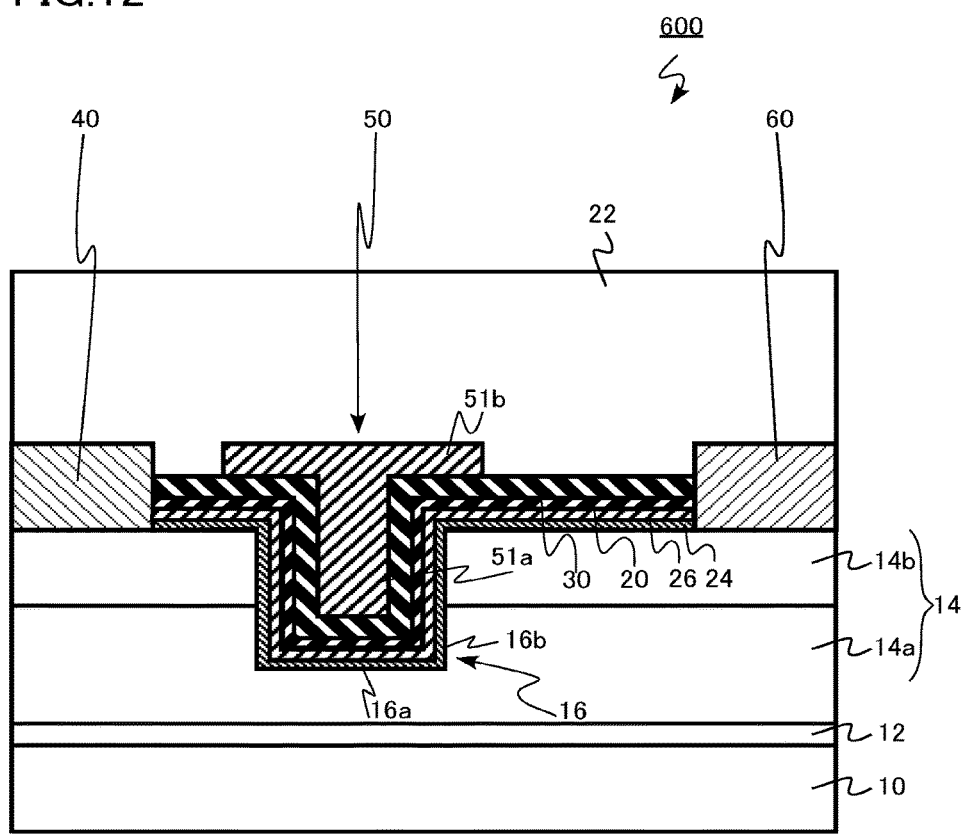
FIG. 12 is a schematic cross sectional view of a semiconductor device of a sixth embodiment.

FIG. 12 is a schematic cross sectional view of the semiconductor device 600 of the present embodiment.

In the semiconductor device 600 of the present embodiment, the first film 20 containing silicon, aluminum, oxygen, and nitrogen, such as SiAlON, is formed between a first oxide film 30 and the second nitride film 26 by a reaction between the first oxide film 30 and the second nitride film 26 by a heat treatment. The second nitride film 26 may disappear due to some kind of reactions in the heat treatment.

According to the semiconductor device 600 of the present embodiment, a semiconductor device in which threshold variation is suppressed can be also provided.

(Seventh Embodiment)

A semiconductor device 700 of the present embodiment is different from the semiconductor device 500 of the fifth embodiment in that a second oxide film 32 is further provided between a first film 20 and a first oxide film 30. Here, description of contents overlapping with the semiconductor device of any one of the first to sixth embodiments will be omitted.

Figure 13:
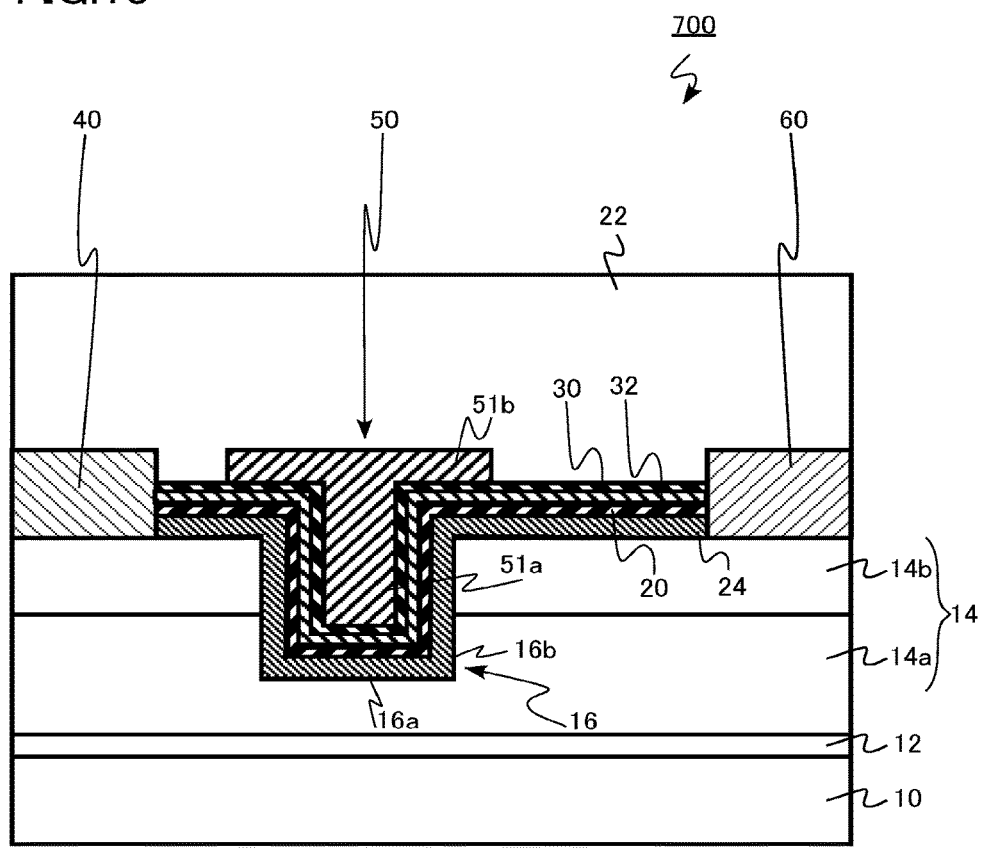
FIG. 13 is a schematic cross sectional view of a semiconductor device of a seventh embodiment.

FIG. 13 is a schematic cross sectional view of the semiconductor device 700 of the present embodiment.

In the semiconductor device 700 of the present embodiment, the first film 20 containing silicon, aluminum, oxygen, and nitrogen, such as SiAlON, is formed between a first nitride film 24 and the second oxide film 32 by a reaction between the first nitride film 24 and the second oxide film 32 by a heat treatment. The first nitride film 24 is preferably a silicon nitride film containing SiN or the like, and the second oxide film 32 is preferably an aluminum oxide film containing $Al_2O_3$ or the like. The second oxide film 32 may disappear due to some kind of reactions in the heat treatment.

According to the semiconductor device 700 of the present embodiment, a semiconductor device in which threshold variation is suppressed can be also provided.

(Eighth Embodiment)

A semiconductor device 800 of the present embodiment is different from the semiconductor device 500 of the fifth embodiment in that the semiconductor device 800 further includes a second oxide film 32 provided between a first nitride film 24 and a first film 20 and a second nitride film 26 provided between the first film 20 and a first oxide film 30. Here, description of contents overlapping with the first to seventh embodiments will be omitted.

Figure 14:
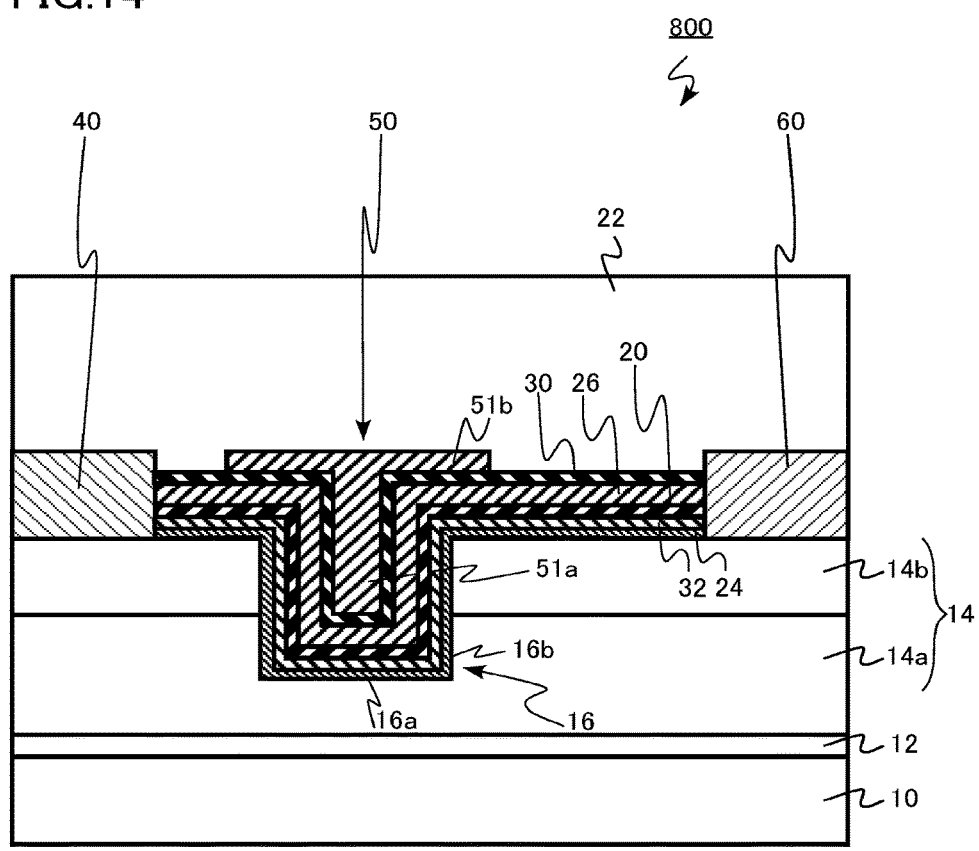
FIG. 14 is a schematic cross sectional view of a semiconductor device of an eighth embodiment.

FIG. 14 is a schematic cross sectional view of the semiconductor device 800 of the present embodiment.

In the semiconductor device 800 of the present embodiment, the first film 20 is formed between the second oxide film 32 and the second nitride film 26 by a reaction between the second oxide film 32 and the second nitride film 26 by a heat treatment. The second oxide film 32 is preferably an aluminum oxide film containing $Al_2O_3$ or the like, and the second nitride film 26 is preferably a silicon nitride film containing SiN or the like. The second oxide film 32 and the second nitride film 26 may disappear according to a degree of the heat treatment.

According to the semiconductor device 800 of the present embodiment, a semiconductor device in which threshold variation is suppressed can be also provided.

(Ninth Embodiment)

A semiconductor device 900 of the present embodiment is different from the semiconductor device 500 of the fifth embodiment in that the semiconductor device 900 further includes a second nitride film 26 provided between a first nitride film 24 and a first film 20 and a second oxide film 32 provided between a first oxide film 30 and the first film 20. Here, description of contents overlapping with the first to eighth embodiments will be omitted.

Figure 15:
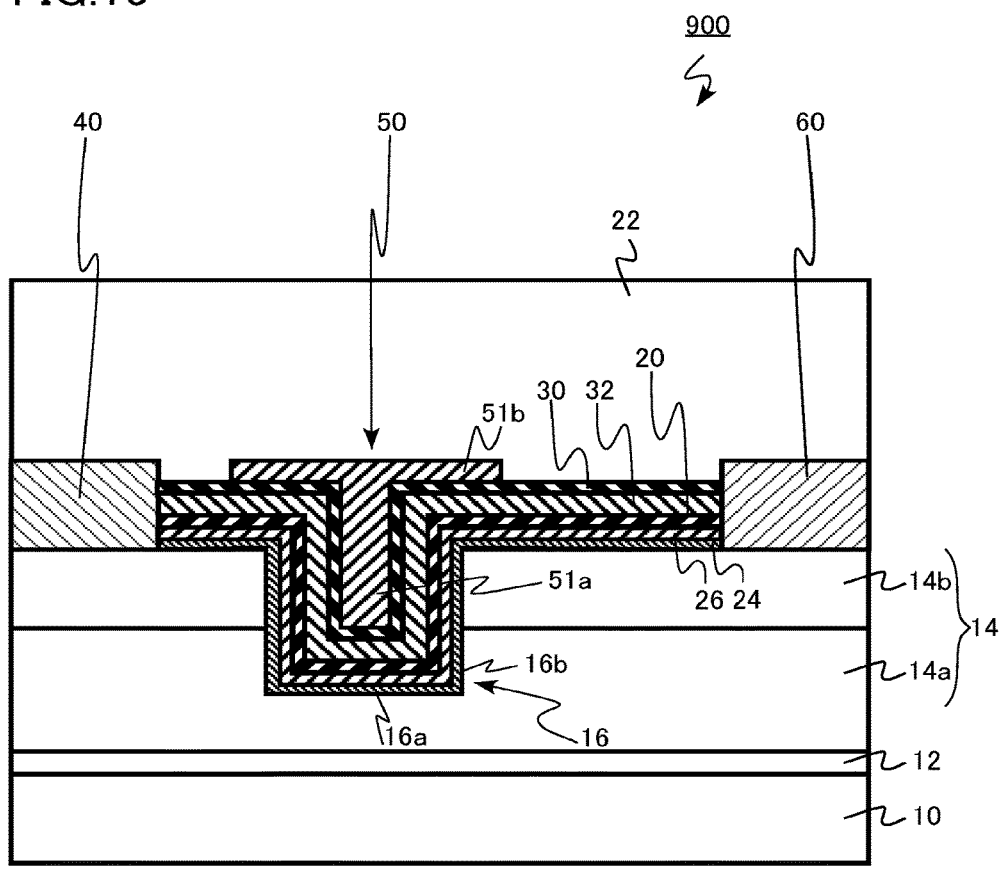
FIG. 15 is a schematic cross sectional view of a semiconductor device of a ninth embodiment.

FIG. 15 is a schematic cross sectional view of the semiconductor device 900 of the present embodiment.

In the semiconductor device 900 of the present embodiment, the first film 20 is formed between the second nitride film 26 and the second oxide film 32 by a reaction between the second nitride film 26 and the second oxide film 32 by a heat treatment. The second nitride film 26 is preferably a silicon nitride film containing SiN or the like, and the second oxide film 32 is preferably an aluminum oxide film containing $Al_2O_3$ or the like. The second nitride film 26 and the second oxide film 32 may disappear according to a degree of the heat treatment.

According to the semiconductor device 900 of the present embodiment, a semiconductor device in which threshold variation is suppressed can be also provided.

(Tenth Embodiment)

A semiconductor device 1000 of the present embodiment is different from the semiconductor device 500 of the fifth embodiment in that the semiconductor device 1000 further includes a second nitride film 26 provided between a first film 20 and a second film 22 and that a first oxide film 30 is provided between a second semiconductor layer 14*b* and the first film 20 and between a first semiconductor layer 14*a* and the first film 20 in a trench 16. Here, description of contents overlapping with the first to ninth embodiments will be omitted.

Figure 16:
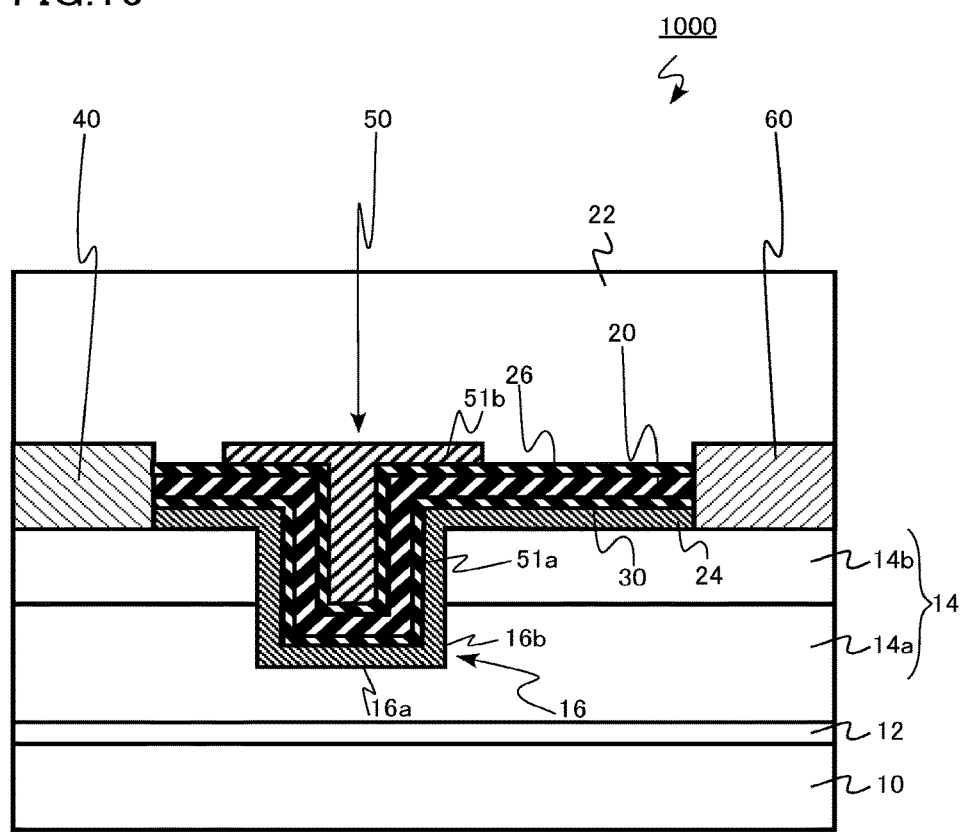
FIG. 16 is a schematic cross sectional view of a semiconductor device of a tenth embodiment.

FIG. 16 is a schematic cross sectional view of the semiconductor device 1000 of the present embodiment.

In the semiconductor device 1000 of the present embodiment, the first film 20 is formed between the first oxide film 30 and the second nitride film 26 by a reaction between the first oxide film 30 and the second nitride film 26 by a heat treatment. If the first oxide film 30 is a silicon oxide film containing $SiO_2$ or the like, the second nitride film 26 is preferably an aluminum nitride film containing AlN or the like. If the first oxide film 30 is an aluminum oxide film containing $Al_2O_3$ or the like, the second nitride film 26 is preferably a silicon nitride film containing SiN or the like. The second nitride film 26 may disappear according to a degree of the heat treatment.

According to the semiconductor device 1000 of the present embodiment, a semiconductor device in which threshold variation is suppressed can be also provided.

(Eleventh Embodiment)

A semiconductor device 1100 of the present embodiment includes a first nitride semiconductor layer 14; a source electrode 40 provided on the first nitride semiconductor layer 14; a drain electrode 60 provided on the first nitride semiconductor layer 14; a gate electrode 50 provided between the source electrode 40 and the drain electrode 60; a first film 20 provided between the source electrode 40 and the gate electrode 50 and between the gate electrode 50 and the drain electrode 60, the first film 20 provided on the gate electrode 50, the first film 20 being provided on the first nitride semiconductor layer 14, and the first film 20 having a lower hydrogen diffusion coefficient than a hydrogen diffusion coefficient of silicon oxide film; and a second film 22 provided on the first film and having a hydrogen concentration of $10^{22}$ cm$^{-3}$ or more. Here, description of contents overlapping with the first to tenth embodiments will be omitted.

Figure 17:
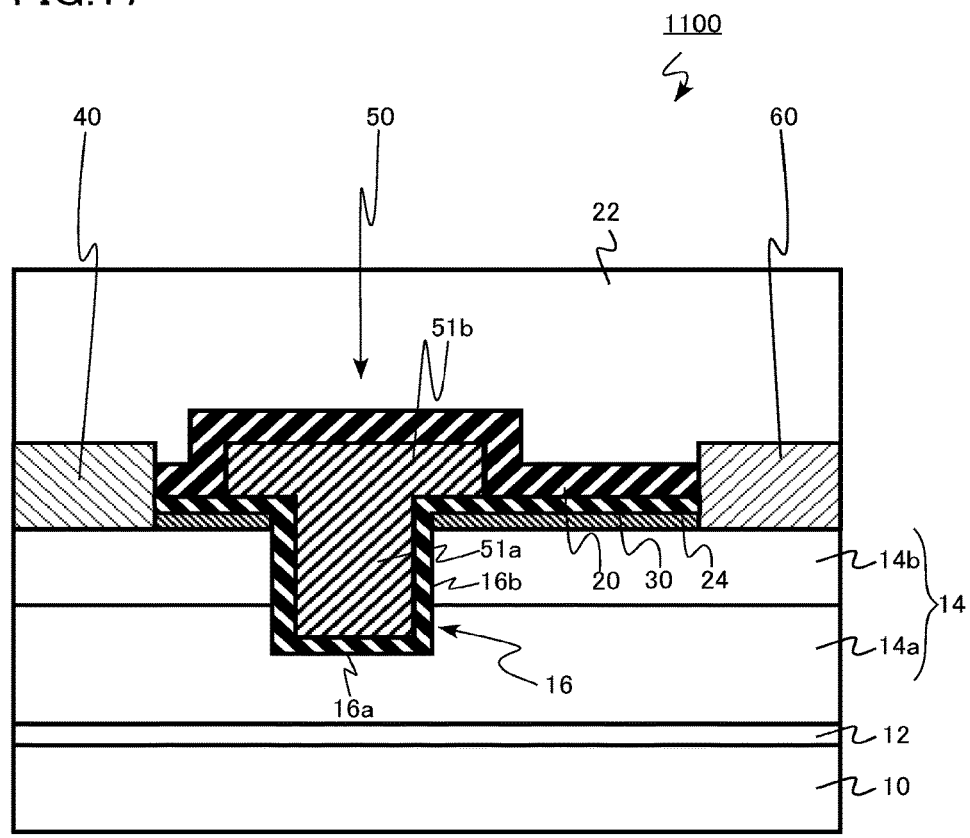
FIG. 17 is a schematic cross sectional view of a semiconductor device of an eleventh embodiment.

FIG. 17 is a schematic cross sectional view of the semiconductor device 1100 of the present embodiment.

In the semiconductor device 1100 of the present embodiment, the first film 20 is also provided on the gate electrode 50, and therefore invasion of hydrogen included in the second film 22 into the first nitride semiconductor layer 14 can be suppressed.

Figure 18A:
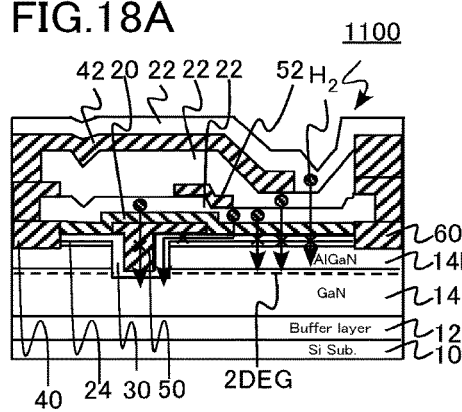
FIGS. 18A-18D are schematic cross sectional views of semiconductor devices of a first modification example of the eleventh embodiment.
Figure 18B:
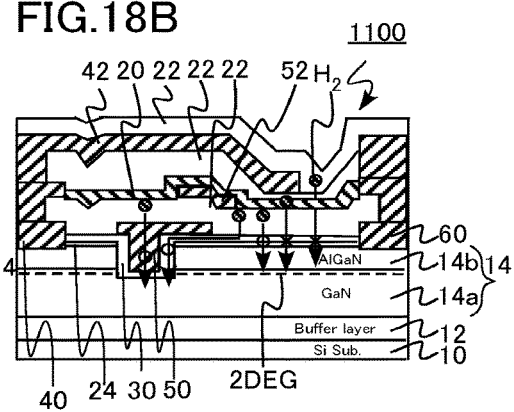
Figure 18C:
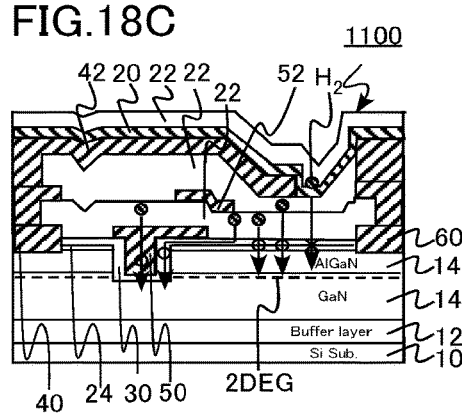
Figure 18D:
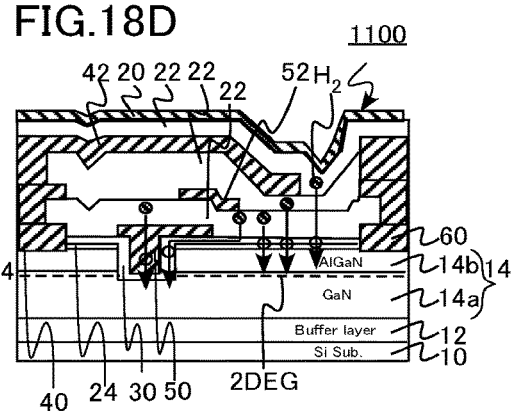

FIGS. 18A-18D are schematic cross sectional views of a first modification example of the semiconductor device 1100 of the present embodiment. In FIG. 18A, the first film 20 is provided in contact with the first oxide film 30 and the gate electrode 50. In FIG. 18B, the first film 20 is provided between a gate field plate electrode 52 and a source field plate electrode 42. In FIG. 18C, the first film 20 is provided in contact with the source field plate electrode 42 on the source field plate electrode 42. In FIG. 18D, the first film 20 is provided on the second film 22 provided on the source field plate electrode 42. In the semiconductor device 1100 illustrated in FIG. 18A, the second film 22 is not provided between the first oxide film 30 and the first film 20 or between the gate electrode 50 and the first film 20. Thus, supply of hydrogen included in the second film 22 to the first nitride semiconductor layer 14 is suppressed most among the semiconductor devices 1100 illustrated in FIGS. 18A-18D. Therefore, the semiconductor device 1100 in FIG. 18A is used most preferably.

Figure 19:
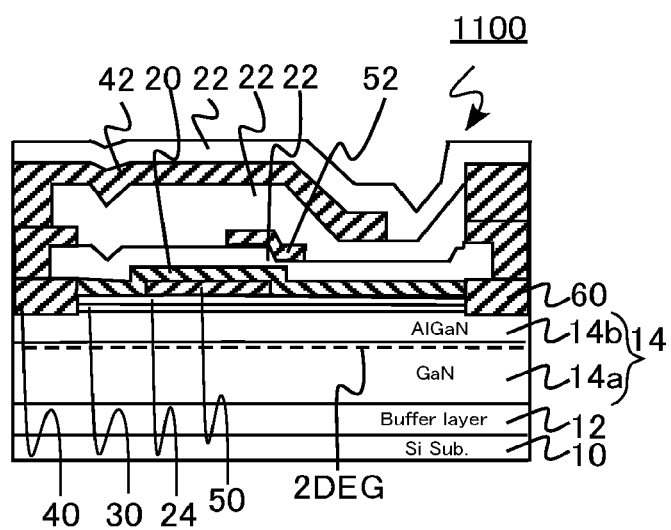
FIG. 19 is a schematic cross sectional view of a semiconductor device of a second modification example of the eleventh embodiment.

FIG. 19 is a schematic cross sectional view of a second modification example of the semiconductor device 1100 of the present embodiment. This semiconductor device 1100 is a normally-on MOSFET having no trench 16.

$H_2$ enters the first nitride semiconductor layer 14, generates an energy level, and makes a semiconductor in the first nitride semiconductor layer 14 an n-type. This generates a leak current other than the current due to the two dimensional electron gas (2DEG) disadvantageously. The first film 20 makes it possible to suppress generation of the leak current.

According to the semiconductor device 1100 of the present embodiment, a semiconductor device in which threshold variation is suppressed can be also provided.

(Twelfth Embodiment)

A semiconductor device 1200 of the present embodiment is different from the semiconductor device 1100 of the eleventh embodiment in that the semiconductor device 1200 further includes a second nitride film 26 provided between a first oxide film 30 and a first film 20 and a second oxide film 32 provided between the first film 20 and a second film 22. Here, description of contents overlapping with the first to eleventh embodiments will be omitted.

Figure 20:
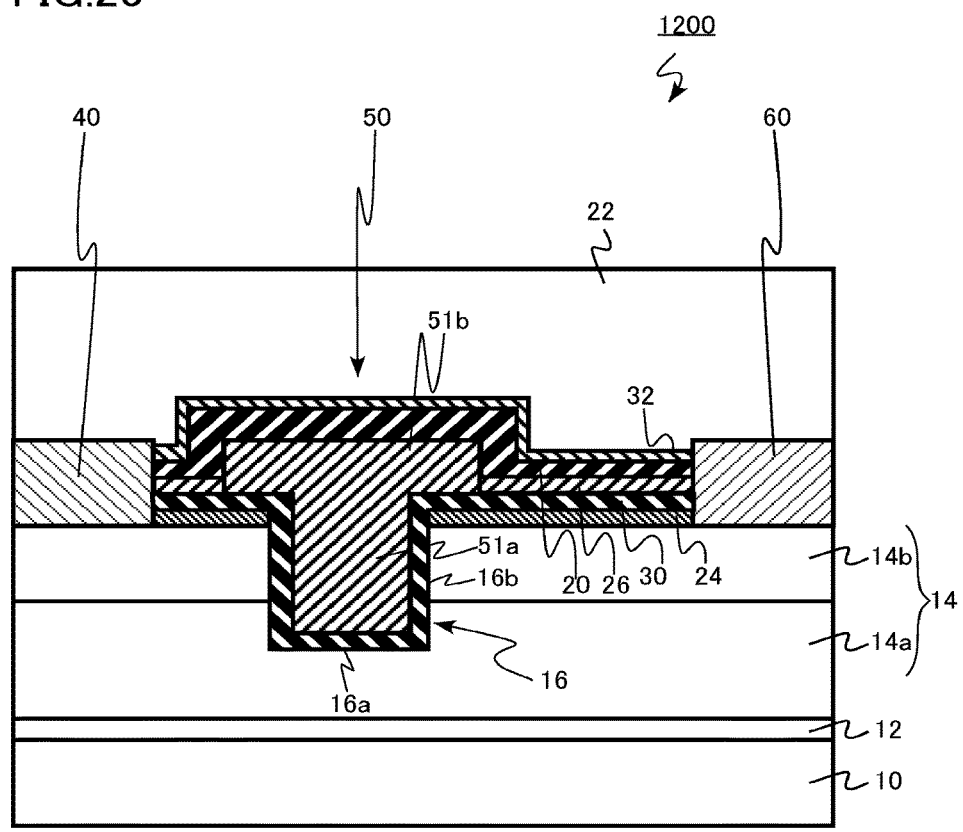
FIG. 20 is a schematic cross sectional view of a semiconductor device of a twelfth embodiment.

FIG. 20 is a schematic cross sectional view of the semiconductor device 1200 of the present embodiment.

In the semiconductor device 1200 of the present embodiment, the first film 20 is formed between the second nitride film 26 and the second oxide film 32 by a reaction between the second nitride film 26 and the second oxide film 32 by a heat treatment. If the second nitride film 26 is a silicon nitride film containing SiN, the second oxide film 32 is preferably an aluminum oxide film containing $Al_2O_3$. If the second nitride film 26 is an aluminum nitride film containing AlN, the second oxide film 32 is preferably a silicon oxide film containing $SiO_2$. The second nitride film 26 or the second oxide film 32 may disappear according to a degree of the heat treatment.

According to the semiconductor device 1200 of the present embodiment, a semiconductor device in which threshold variation is suppressed can be also provided.

(Thirteenth Embodiment)

A semiconductor device 1300 of the present embodiment is different from the semiconductor device 1100 of the eleventh embodiment in that the semiconductor device 1300 further includes a second oxide film 32 provided between a first oxide film 30 and a first film 20 and a second nitride film 26 provided between the first film 20 and a second film 22. Here, description of contents overlapping with the first to twelfth embodiments will be omitted.

Figure 21:
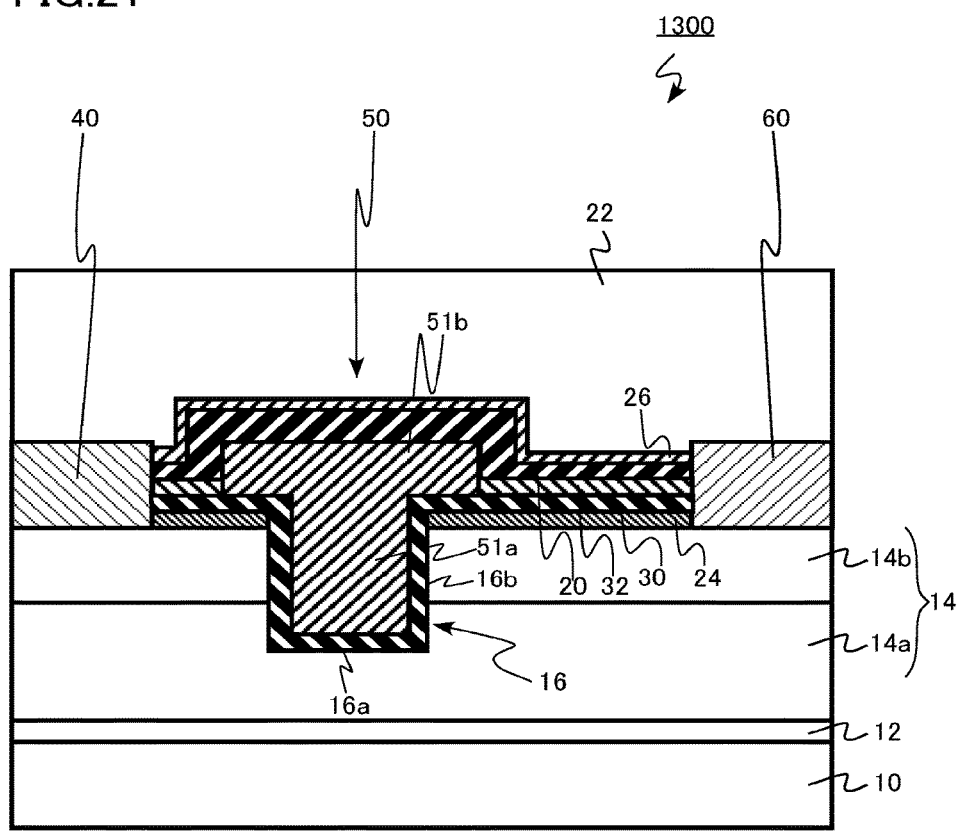
FIG. 21 is a schematic cross sectional view of a semiconductor device of a thirteenth embodiment.

FIG. 21 is a schematic cross sectional view of the semiconductor device 1300 of the present embodiment.

In the semiconductor device 1300 of the present embodiment, the first film 20 is formed between the second oxide film 32 and the second nitride film 26 by a reaction between the second oxide film 32 and the second nitride film 26 by a heat treatment.

According to the semiconductor device 1300 of the present embodiment, a semiconductor device in which threshold variation is suppressed can be also provided.

(Fourteenth Embodiment)

A semiconductor device 1400 of the present embodiment includes a first nitride semiconductor layer 14; a source electrode 40 provided on the first nitride semiconductor layer 14; a drain electrode 60 provided on the first nitride semiconductor layer 14; a gate electrode 50 provided between the source electrode 40 and the drain electrode 60; a p-type second nitride semiconductor layer 18 provided between the first nitride semiconductor layer 14 and the gate electrode 50; a first film 20 provided between the source electrode 40 and the gate electrode 50 and between the gate electrode 50 and the drain electrode 60, the first film 20 being provided on the first nitride semiconductor layer 14 and on the gate electrode 50 and the first film 20 having a lower hydrogen diffusion coefficient than a silicon oxide film; and a second film 22 provided on the first film 20 and having a hydrogen concentration of $10^{22}$ $cm^{-3}$ or more. Here, description of contents overlapping with the first to thirteenth embodiments will be omitted.

Figure 22:
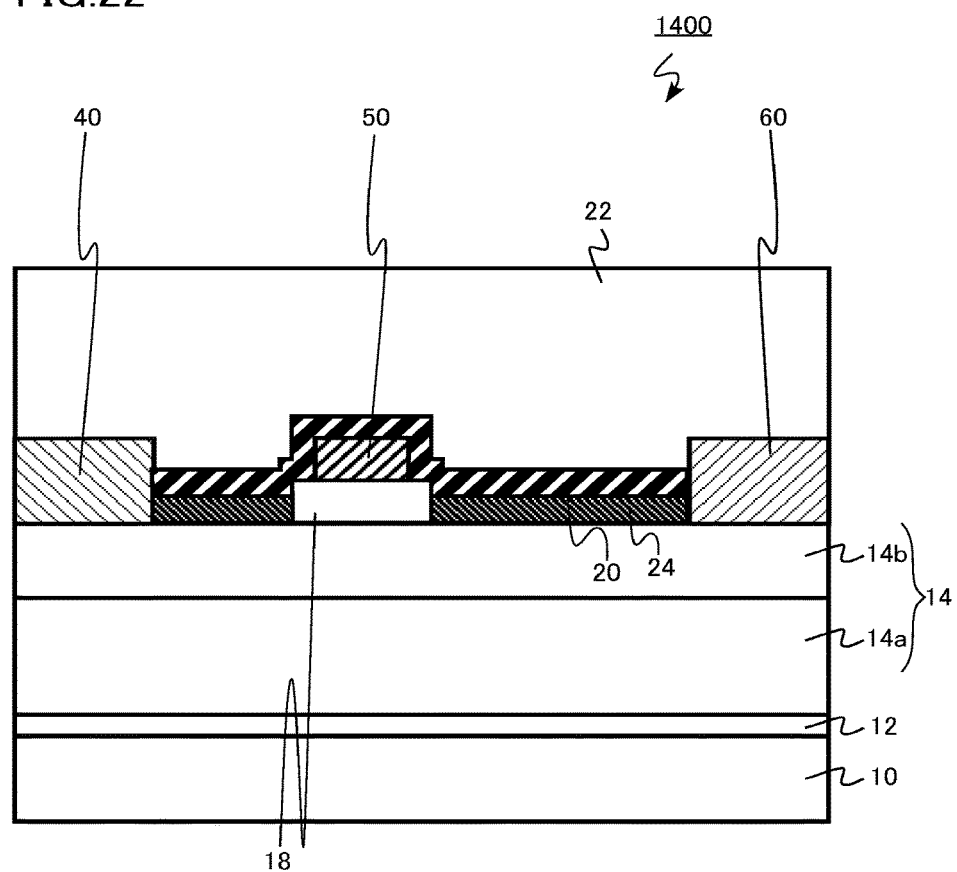
FIG. 22 is a schematic cross sectional view of a semiconductor device of a fourteenth embodiment.

FIG. 22 is a schematic cross sectional view of the semiconductor device 1400 of the present embodiment. The semiconductor device 1400 of the present embodiment is a junction field effect transistor (JFET).

For example, magnesium (Mg) or carbon (C) is used for p-type impurities of a nitride semiconductor. Magnesium and carbon are likely to be bonded to hydrogen easily. In this case, magnesium or carbon bonded to hydrogen does not act as a dopant and reduces an activation ratio disadvantageously.

In the semiconductor device 1400 of the present embodiment, the first film 20 is provided, and therefore hydrogen in the second film 22 does not enter the first nitride semiconductor layer 14 easily. Therefore, the activation ratio of magnesium or carbon injected as p-type impurities can be increased.

According to the semiconductor device 1400 of the present embodiment, a semiconductor device in which threshold variation is suppressed and has a high activation ratio of impurities can be provided.

(Fifteenth Embodiment)

A semiconductor device 1500 of the present embodiment is different from the semiconductor device 1300 of the thirteenth embodiment in that the semiconductor device 1500 further includes a second nitride film 26 provided between a first nitride film 24 and a first film 20 and a second oxide film 32 provided between the first film 20 and a second film 22. Here, description of contents overlapping with the first to fourteenth embodiments will be omitted.

Figure 23:
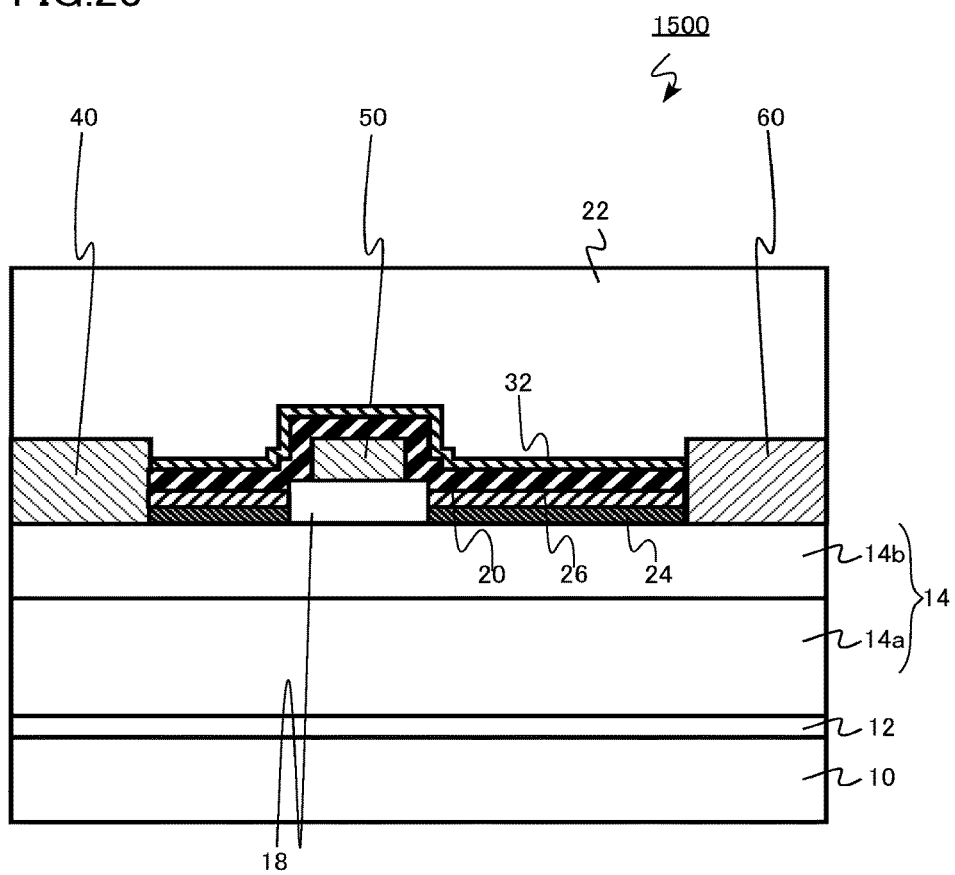
FIG. 23 is a schematic cross sectional view of a semiconductor device of a fifteenth embodiment.

FIG. 23 is a schematic cross sectional view of the semiconductor device 1500 of the present embodiment.

In the semiconductor device 1500 of the present embodiment, the first film 20 is formed between the second nitride film 26 and the second oxide film 32 by a reaction between the second nitride film 26 and the second oxide film 32 by a heat treatment. If the second nitride film 26 is a silicon nitride film containing SiN, the second oxide film 32 is preferably an aluminum oxide film containing $Al_2O_3$. If the second nitride film 26 is an aluminum nitride film containing AlN, the second oxide film 32 is preferably a silicon oxide film containing $SiO_2$. The second nitride film 26 or the second oxide film 32 may disappear according to a degree of the heat treatment.

According to the semiconductor device 1500 of the present embodiment, a semiconductor device in which threshold variation is suppressed and has a high activation ratio of impurities can be provided.

(Sixteenth Embodiment)

A semiconductor device 1600 of the present embodiment is different from the semiconductor device 1400 of the fourteenth embodiment in that the semiconductor device 1600 further includes a second oxide film 32 provided between a first nitride film 24 and a first film 20 and a second nitride film 26 provided between the first film 20 and a second film 22. Here, description of contents overlapping with the first to fifteenth embodiments will be omitted.

Figure 24:
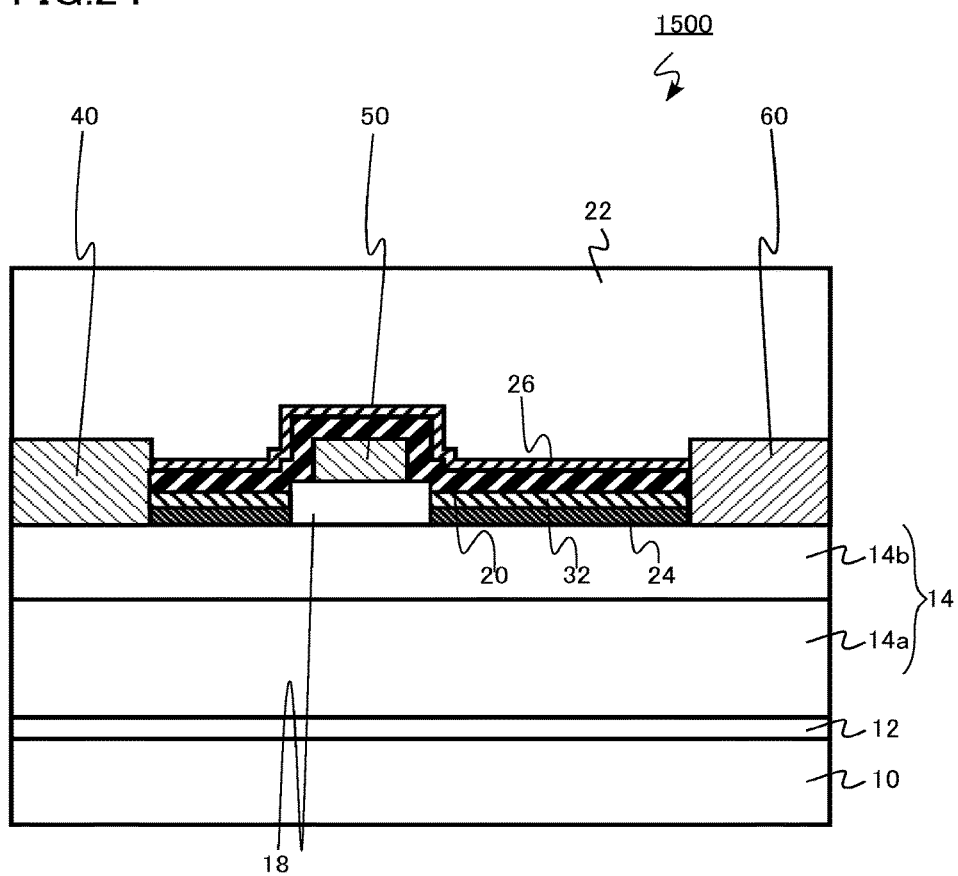
FIG. 24 is a schematic cross sectional view of a semiconductor device of a sixteenth embodiment.

FIG. 24 is a schematic cross sectional view of the semiconductor device 1600 of the present embodiment.

In the semiconductor device 1600 of the present embodiment, the first film 20 is formed between the second oxide film 32 and the second nitride film 26 by a reaction between the second oxide film 32 and the second nitride film 26 by a heat treatment.

According to the semiconductor device 1600 of the present embodiment, a semiconductor device in which threshold variation is suppressed can be also provided.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first nitride semiconductor layer;
    a source electrode provided directly on the first nitride semiconductor layer;
    a drain electrode provided directly on the first nitride semiconductor layer;
    a gate electrode provided between the source electrode and the drain electrode;
    a first film provided between the source electrode and the gate electrode and between the gate electrode and the drain electrode, the first film being provided on the first nitride semiconductor layer, the first film having a lower hydrogen diffusion coefficient than a hydrogen diffusion coefficient of a silicon oxide film; and
    a second film provided on the first film.

2. The semiconductor device according to claim 1, wherein the first film comprises silicon, aluminum, oxygen, and nitrogen.

3. The semiconductor device according to claim 1, wherein the first film comprises SiAlON.

4. The semiconductor device according to claim 1, wherein the second film has a hydrogen concentration of $10^{22}$ cm$^{-3}$ or more.

5. The semiconductor device according to claim 1, further comprising a first oxide film provided between the first film and the second film and between the first nitride semiconductor layer and a first electrode in a trench,
    the first nitride semiconductor layer comprising a first semiconductor layer, a second semiconductor layer provided on the first semiconductor layer, and the trench provided on the first nitride semiconductor layer, the second semiconductor layer having a larger bandgap than the first semiconductor layer, and
    the gate electrode comprising the first electrode provided in the trench.

6. The semiconductor device according to claim 5, further comprising a first nitride film provided between the first film and the first oxide film, between the first nitride semiconductor layer and the first oxide film in the trench.

7. The semiconductor device according to claim 6, wherein the thickness of the first nitride film is smaller than the thickness of the first oxide film.

8. The semiconductor device according to claim 6, wherein the thickness of the first nitride film is 0.2 nm or more and less than 2 nm.

9. The semiconductor device according to claim 6, wherein the sum of equivalent film thicknesses of the first nitride film and the first oxide film is 20 nm or more and 100 nm or less.

10. The semiconductor device according to claim 6, wherein the first nitride film comprises single crystal aluminum nitride.

11. The semiconductor device according to claim 1, further comprising a first oxide film provided between the first film and the first nitride semiconductor layer and between the first nitride semiconductor layer and a first electrode in a trench,
    the first nitride semiconductor layer comprising a first semiconductor layer, a second semiconductor layer provided on the first semiconductor layer, and the trench provided on the first nitride semiconductor layer, the second semiconductor layer having a larger bandgap than the first semiconductor layer, and
    the gate electrode comprising the first electrode provided in the trench.

12. The semiconductor device according to claim 11, further comprising a first nitride film provided between the first nitride semiconductor layer and the first oxide film and between the first nitride semiconductor layer and the first oxide film in the trench.

13. The semiconductor device according to claim 1, wherein the source electrode and the drain electrode are aligned perpendicular to the lamination direction of the first nitride semiconductor layer and the first film.

14. The semiconductor device according to claim 1, wherein the first film is provided between the source electrode and the gate electrode in a direction perpendicular to the lamination direction of the first nitride semiconductor layer and the first film, and between the gate electrode and the drain electrode in the direction perpendicular to the lamination direction of the first nitride semiconductor layer and the first film.

15. A semiconductor device comprising:
    a first nitride semiconductor layer comprising a first semiconductor layer, a second semiconductor layer provided on the first semiconductor layer, and a trench provided on the first nitride semiconductor layer, the second semiconductor layer having a larger bandgap than the first semiconductor layer;
    a source electrode provided directly on the first nitride semiconductor layer;
    a drain electrode provided directly on the first nitride semiconductor layer;
    a gate electrode comprising a first electrode provided in the trench, the gate electrode provided between the source electrode and the drain electrode;
    a first film comprising a first portion, a second portion and a third portion, the first portion provided between the source electrode and the gate electrode, the first portion provided on the first nitride semiconductor layer, the second portion provided between the gate electrode and the drain electrode, the second portion provided on the first nitride semiconductor layer, the third portion provided between the first nitride semiconductor layer and the first electrode, and the first film having a lower hydrogen diffusion coefficient than a hydrogen diffusion coefficient of silicon oxide film; and
    a second film provided on the first film.

16. The semiconductor device according to claim 15, wherein the first film comprises silicon, aluminum, oxygen, and nitrogen.

17. The semiconductor device according to claim 15, further comprising a first oxide film provided between the first film and the second film and between the first film and the first electrode.

18. The semiconductor device according to claim 15, further comprising a first oxide film provided between the first nitride semiconductor layer and the first film, and between the first nitride semiconductor layer and the first film in the trench.

19. A semiconductor device comprising:
- a first nitride semiconductor layer;
- a source electrode provided directly on the first nitride semiconductor layer;
- a drain electrode provided directly on the first nitride semiconductor layer;
- a gate electrode provided between the source electrode and the drain electrode;
- a first film provided between the source electrode and the gate electrode and between the gate electrode and the drain electrode, the first film provided on the gate electrode, the first film being provided on the first nitride semiconductor layer, and the first film having a lower hydrogen diffusion coefficient than a hydrogen diffusion coefficient of silicon oxide film; and
- a second film provided on the first film.

20. The semiconductor device according to claim 19, further comprising a p-type second nitride semiconductor layer provided between the first nitride semiconductor layer and the gate electrode.

21. The semiconductor device according to claim 19, wherein the first film comprises silicon, aluminum, oxygen, and nitrogen.

* * * * *